United States Patent
Tambouris

(10) Patent No.: US 7,586,349 B2
(45) Date of Patent: Sep. 8, 2009

(54) CMOS INTEGRATED CIRCUIT FOR CORRECTION OF DUTY CYCLE OF CLOCK SIGNAL

(75) Inventor: Sotirios Tambouris, Munich (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 11/424,980

(22) Filed: Jun. 19, 2006

(65) Prior Publication Data

US 2006/0284659 A1 Dec. 21, 2006

(30) Foreign Application Priority Data

Jun. 17, 2005 (DE) .................. 10 2005 028 173

(51) Int. Cl.
*H03K 3/017* (2006.01)
(52) U.S. Cl. ...................... 327/175; 327/172
(58) Field of Classification Search ........... None
See application file for complete search history.

(56) References Cited

U.S. PATENT DOCUMENTS

| | | | |
|---|---|---|---|
| 5,907,254 A | 5/1999 | Chang | |
| 6,198,322 B1 | 3/2001 | Yoshimura | |
| 6,320,438 B1 * | 11/2001 | Arcus | 327/175 |
| 6,384,652 B1 | 5/2002 | Shu | |
| 6,545,503 B1 * | 4/2003 | Tomasini et al. | 326/27 |
| 6,576,962 B2 * | 6/2003 | Rockett | 257/367 |
| 6,654,900 B1 * | 11/2003 | Cave | 713/501 |
| 6,847,244 B2 * | 1/2005 | Pillay et al. | 327/174 |
| 6,967,514 B2 * | 11/2005 | Kizer et al. | 327/175 |
| 7,199,634 B2 * | 4/2007 | Cho et al. | 327/175 |
| 2002/0070752 A1 | 6/2002 | Harrison | |
| 2002/0084817 A1 * | 7/2002 | Nair et al. | 327/175 |
| 2003/0111705 A1 * | 6/2003 | Seo | 257/491 |
| 2004/0135608 A1 * | 7/2004 | Pillay et al. | 327/175 |
| 2005/0134341 A1 * | 6/2005 | Lee | 327/172 |

FOREIGN PATENT DOCUMENTS

| | | |
|---|---|---|
| WO | WO 84/00262 | 7/1984 |
| WO | WO 03/090355 | 10/2003 |

* cited by examiner

*Primary Examiner*—Cassandra Cox
(74) *Attorney, Agent, or Firm*—John J. Patti; Wade J. Brady, III; Frederick J. Telecky, Jr.

(57) ABSTRACT

A CMOS integrated circuit (12) for correction of the duty cycle of a clock signal has a correction amplifier (16) to which a clock signal (14) is applied. The output of correction amplifier (16) is connected to an output buffer (18) and to an input of a duty cycle detector (20), the output of which is fed back to a control input (VC) of correction amplifier (16), thus forming a control loop. The duty cycle detector (20) comprises a buffer amplifier (22), an RC low pass circuit and a second inverter (24). A deviation of the duty cycle of the clock signal is detected in the duty cycle detector 20 and used to correct the duty cycle in the correction amplifier 16.

12 Claims, 3 Drawing Sheets

CMOS INTEGRATED CIRCUIT FOR CORRECTION OF DUTY CYCLE OF CLOCK SIGNAL

The invention relates to a CMOS integrated circuit for correction of the duty cycle of a clock signal.

BACKGROUND

Many integrated circuit applications need a full swing clock signal with a high precision clock duty cycle. The clock duty cycle is defined as the ratio of the output time during which the clock pulse is at a high level to the total clock cycle time period.

$$\text{Duty Cycle} = T_{high}/T_{period}$$

In double data rate applications (DDR), for example, both the rising and falling edges of a clock signal are used to write data into a flip-flop. Therefore, DDR systems demand a high precision duty cycle with a maximum deviation of +/−0.5%. This high precision must be guaranteed over a large frequency range and over variations which can be due to the process, to voltage fluctuations or to temperature. Even clock signals which are generated using a phase locked loop do not provide the necessary performance.

Current duty cycle correction circuits include operational amplifiers which use current mirrors for generating a correction voltage. But any mismatch of the transistors in the current mirror will result in a correction voltage offset. This offset directly influences the duty cycle of the output.

Furthermore, a differential amplifier generates the correction voltage by comparing the actual signal DC voltage to a reference voltage. This approach requires a zero offset of the reference voltage in combination with the differential amplifier, which is very difficult over process, voltage and temperature variations.

Therefore, there is a need for a duty cycle correction circuit wherein any transistor mismatch is cancelled out and no operational amplifiers are needed. This will lead to an easy implementation.

Furthermore, there is a need for a duty cycle correction circuit that allows a wide frequency range, uses a small chip area and has a low current consumption.

SUMMARY

The invention provides a clock signal duty cycle correction circuit for a CMOS integrate circuit. The circuit comprises a correction amplifier with an input to which an input clock signal is applied and an output to which a capacitor is connected. The inventive circuit further comprises a voltage controlled resistor arrangement which is connected in the current path of the correction amplifier and which has a resistance control input, and a duty cycle detector with an input to which the output of the correction amplifier is applied and which has a detection output that supplies the correction voltage representative of a detected duty cycle. The output of the duty cycle detector is applied to the resistance control input of the voltage controlled resistor arrangement. The inventive CMOS duty cycle correction circuit forms a control loop with the duty cycle detector in the feedback path.

In a preferred embodiment, the duty cycle detector comprises a buffer amplifier and an RC low pass circuit connected to the output of the buffer amplifier. Preferably, the time constant t of the low pass circuit which is the product of the resistance R and the capacitance C is much greater than a period of the clock signal. The voltage output of the RC low pass circuit is indicative of the actual duty cycle. If a clock signal with a low level of 0 V and a high level of VDD is supplied to the RC low pass circuit, the RC low pass circuit delivers a DC voltage of VDD/2 for a duty cycle of 50%, a DC voltage between VDD and VDD/2 for a duty cycle of greater than 50% and a DC voltage between 0 V and VDD/2 for a duty cycle of less than 50%.

In a further embodiment, the correction amplifier comprises a complementary MOS transistor pair with interconnected gates to which the input clock signal is applied, and the voltage controlled resistor arrangement comprises a series connected complementary MOS transistor pair with interconnected gates to which the output of the duty cycle detector is applied. Thus, the output of the duty cycle detector which indicates the actual duty cycle controls the resistors of the voltage controlled resistor arrangement. The resistors are formed by appropriately sized MOS transistors. The voltage controlled resistor arrangement is connected in the current path of the correction amplifier and forms a low pass together with the capacitor which is connected to the output of the correction amplifier. The capacitor may be one inherent to the integrated circuit. Changing the resistor values influences the rising or falling times of the data signal edges.

The signal output of the duty cycle corrector is fed into an output buffer, which is formed by a series connected complementary MOS transistor pair.

BRIEF DESCRIPTION OF THE DRAWINGS

Example embodiments are described below, with reference to accompanying drawings, wherein.

DETAILED DESCRIPTION OF THE EMBODIMENTS

Figure 1:
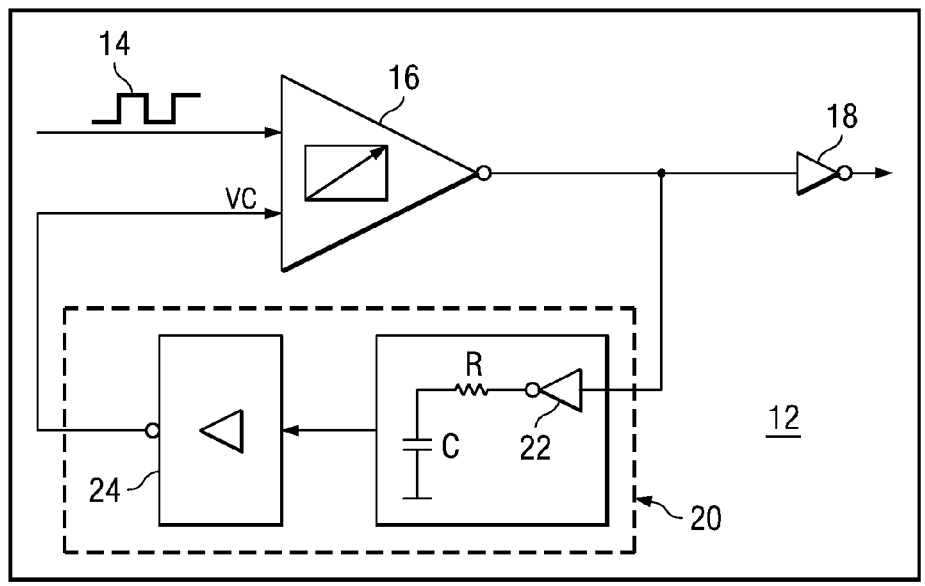
FIG. 1 is the schematic representation of an embodiment of the inventive duty cycle correction circuit.

FIG. 1 shows the principal building blocks of an example embodiment of a CMOS duty cycle correction circuit 12, in accordance with the invention. A clock signal 14 is applied to a correction amplifier 16. The output of correction amplifier 16 is connected to an output buffer 18 and to an input of a duty cycle detector 20, the output of which is fed back to a control input VC of correction amplifier 16, thus forming a control loop. In the duty cycle correction circuit 12, a deviation of the duty cycle of the clock signal is detected in the duty cycle detector 20 and used to correct the duty cycle in the correction amplifier 16. The duty cycle detector 20 comprises a buffer amplifier 22, an RC low pass circuit which is formed by a low pass capacitor C, a resistor R, and a second inverter 24. The input of the RC low pass circuit is connected to the output of buffer amplifier 22. The output of the RC low pass circuit is fed into the second inverter 24.

Figure 2A:
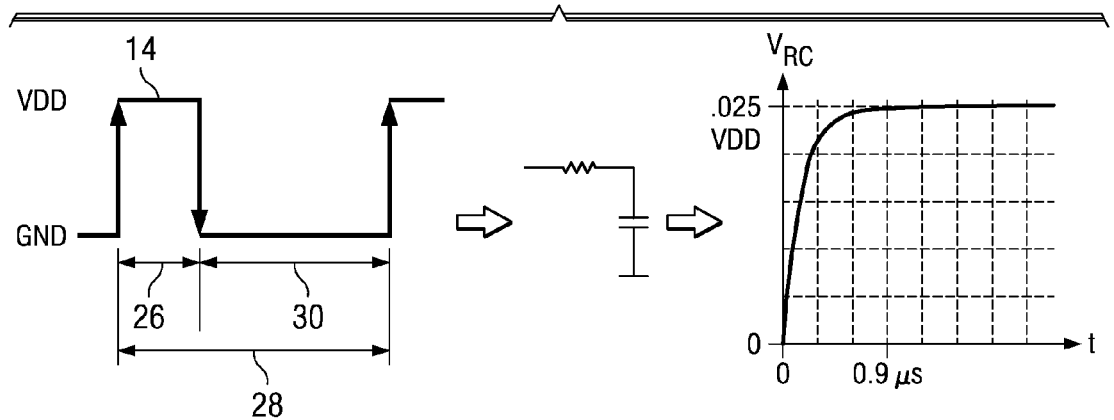
FIGS. 2a and 2b show the influence of an RC low pass circuit on a clock signal.
Figure 2B:
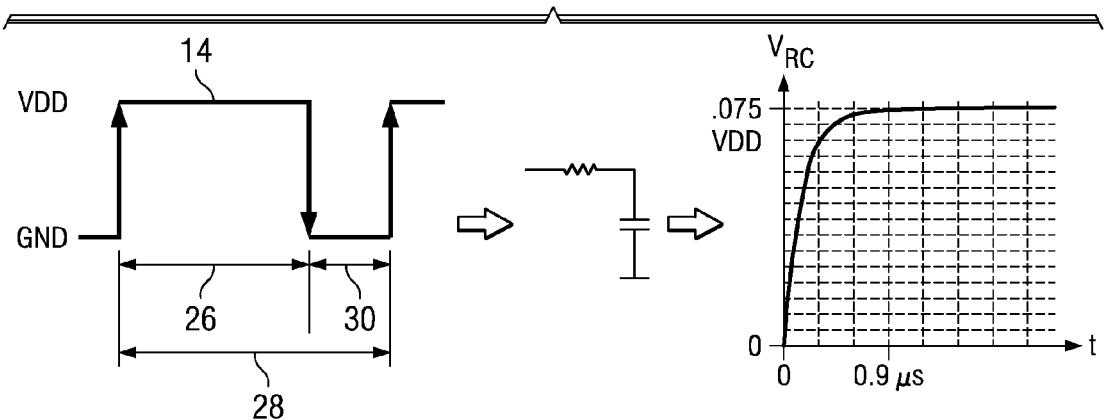

The detection of the actual duty cycle of the clock signal is effectuated by the RC low pass circuit whose function is explained with reference to FIGS. 2a and 2b. FIG. 2a shows a clock signal 14 with a duty cycle of 25%, i.e., the time period 26 in which the clock signal is high is 25% of the total clock cycle time period 28 which is the period of the clock signal. The time period 30 during which the clock signal is low is 75% of the clock signal period 28. If this clock signal is passed through the RC low pass circuit, the output voltage $V_{RC}$ over the capacitor C will initially increase while the capacitor C is charged and then remain at a level which is 0.25 times VDD. For a clock signal at 200 MHz, it will take about 0.9 microseconds to charge the capacitor C to this level, as illustrated by the graph in FIG. 2a. FIG. 2b shows an input clock signal 14 wherein the time period 26 during which the clock signal is high is 75% of the total clock signal period 28. Thus, the duty cycle is 75%. Again the output voltage $V_{RC}$ over time is graphically shown. While the capacitor C is charged, the output voltage $V_{RC}$ will initially increase and then stay at 0.75 times VDD. This level is reached after about 0.9 microseconds. As the graphs in FIGS. 2a and 2b show, after a transient time the output voltage $V_{RC}$ of the RC low pass circuit is proportional to the duty cycle. The function of the RC low pass circuit is insensitive to fluctuations in the values of the resistance R and the capacitance C, so long as the time constant t =R*C is much greater than the period of the clock signal. This leads to a detection method which is insensitive to process variations and to the ambient temperature. The output voltage $V_{RC}$ is proportional to the supply voltage VDD and to the duty cycle of the clock signal.

Figure 3:
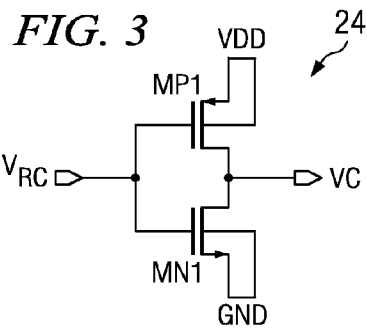
FIG. 3 shows an inverting amplifier comprising a complementary MOS transistor pair.

The output voltage VRC of the RC low pass circuit needs to be amplified in order to achieve a certain loop gain. This amplification is effectuated by the second inverter 24, which is a CMOS inverter cell operating in an analog mode. FIG. 3 shows inverter 24 in more detail. Second inverter 24 comprises a complementary MOS transistor pair, with a PMOS transistor MP1 and an NMOS transistor MN1. The gates and the drains of transistors MP1 and MN1 are interconnected. The source of transistor MP1 is connected to VDD and the source of NMOS transistor MN1 is connected to ground. The output voltage $V_{RC}$ of the RC low pass circuit is supplied to the two gates. The interconnected drains form the control voltage VC output of the inverter cell. The input voltage $V_{RC}$ is amplified by the inverter gain, and the phase shift from input to output is 180°. Using this simple amplifier has the advantage that it is a stable amplifier by construction and only two transistors are needed. There is no feedback as in an operational amplifier. This amplifier provides the necessary gain in order to keep the loop in a mode where the duty cycle can be pulled into its almost ideal value of 50%. On the one hand, the lower the gain is made, the lower the duty cycle accuracy will be. On the other hand, the larger the gain, the greater will be the sensitivity to supply voltage VDD distortions. So, a good compromise for inverter 24 is to use a gain of about 10 to 15.

Figure 4A:
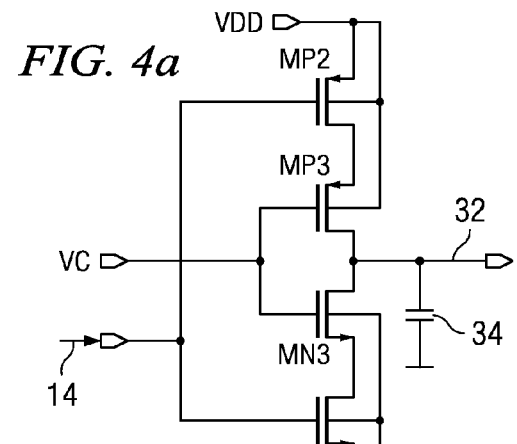
FIGS. 4a and 4b show two different implementations for a duty cycle corrector according to the invention.
Figure 4B:
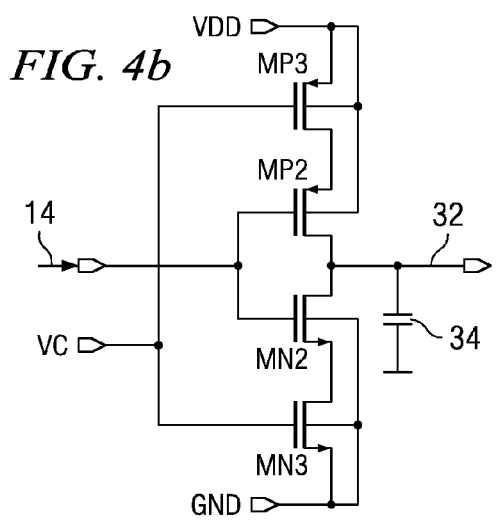

FIGS. 4a and 4b show in more detail two embodiments of the correction amplifier 16 to which the output voltage of inverter 24 is fed. In both embodiments, correction amplifier 16 comprises two pairs of complementary MOS transistors. The input clock signal 14 is applied to the gates of a complementary MOS transistor pair MP2 and MN2 acting as switches, and the control voltage VC is applied to the gates of a second complementary MOS transistor pair MP3 and MN3 forming a voltage controlled resistor arrangement. The transistors MP3 and MN3 are smaller in size than transistors MP2 and MN2, so they are of a much higher resistance. The voltage applied to the respective gates of transistors MP3 and MN3 controls their respective source-to-drain resistances.

In FIG. 4a, PMOS transistor MP2 is connected with its source to the supply voltage VDD, while NMOS transistor MN2 is connected with its source to ground. Transistors MP2 and MN2 act as switches and are driven by input clock signal 14.

The control voltage VC is applied to the gates of the transistors MP3 and MN3 of the second complementary MOS transistor pair. Transistors MP3 and MN3 are interconnected by their drains forming an output 32 of the correction amplifier 16. A charge capacitor 34 is connected to output 32. This charge capacitor 34 may be formed by an inherent capacitance due to transmission lines or by a parasitic transistor capacitance. The source of PMOS transistor MP3 is connected to the drain of PMOS transistor MP2, and the source of NMOS transistor MN3 is connected to the drain of NMOS transistor MN2. Transistors MP3 and MN3 form a voltage controlled resistor arrangement which connects the MOS transistors MP2, MN2 in series with each other. The drain source resistance of each of transistors MP2, MN2 is controlled by the applied gate voltage which is the control voltage VC output from duty cycle detector 20. Together with the capacitor 34, these voltage controlled resistors form a low pass filter. If control voltage VC is greater than VDD/2, transistor MN2 is more conducting than transistor MP3. This results in a faster falling edge at the output 32. If control voltage VC is smaller than VDD/2, the resistance of MP3 is lowered so that the rising edge of the clock signal at the output 32 gets faster. By so controlling the rise and fall times of the output signal, the duty cycle of the clock signal is adjusted.

In FIG. 4b, like named transistors have the same function as those in FIG. 4a. The transistors of MOS transistor pair MP2 and MN2 act as switches driven by the clock signal 14, and the transistors of the MOS transistor pair MP3 and MN3 form a voltage controlled resistor arrangement controlled by the control voltage VC. But in the embodiment shown in FIG. 4b, it is PMOS transistor MP3 which is connected with its source to the supply voltage VDD while NMOS transistor MN3 is connected with its source to ground. Transistors MP2 and MN2 connect transistors MP3 and MN3 in series with each other. The output 32 is formed by the interconnected drains of transistors MP2 and MN2. The function is otherwise the same as explained with respect to FIG. 4a.

Figure 5A:
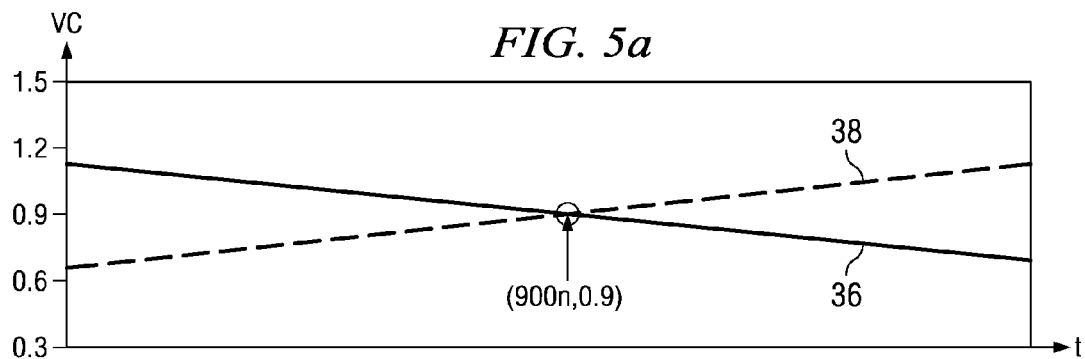
FIGS. 5a and 5b show graphically the transfer function of the duty cycle corrector of FIGS. 4a and 4b.
Figure 5B:
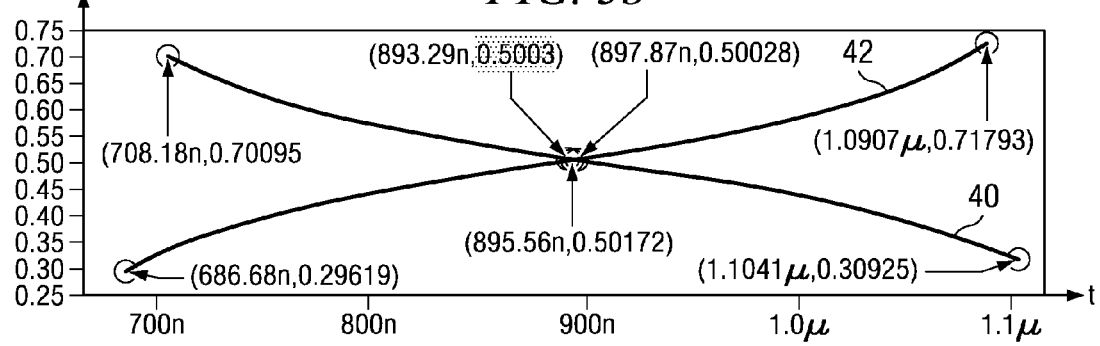

Using the inventive duty cycle corrector, there are no offset problems. The output duty cycle of the clock signal is correctly adjusted, independently of whether the control voltage VC rises or decreases, as shown by the graphs in FIGS. 5a and 5b. In FIGS. 5a and 5b, it is assumed that the control voltage VC varies between 0 V and 1.8 V. FIG. 5a shows a graph of the control voltage VC over time. Line 36 shows a control voltage which is ramped down from approximately 1.15 V to approximately 0.65 V. Line 38 shows a control voltage which is ramped up over time from a voltage of approximately 0.65 V to a voltage of approximately 1.15 V. The two lines are symmetric and cross at 0.9 V. FIG. 5b shows graphically the corresponding duty cycles. Line 40 corresponds to line 38 in FIG. 5a, and line 42 corresponds to line 36. When the control voltage VC has a value of 0.9 V, both lines 40 and 42 show a duty cycle of 0.5 for the output clock signal. There is no offset effect and, thus, there is no hysteresis. The duty cycle correction circuit adjusts the duty cycle to the required precision of, e.g., +/−0.5% or less.

Figure 6:
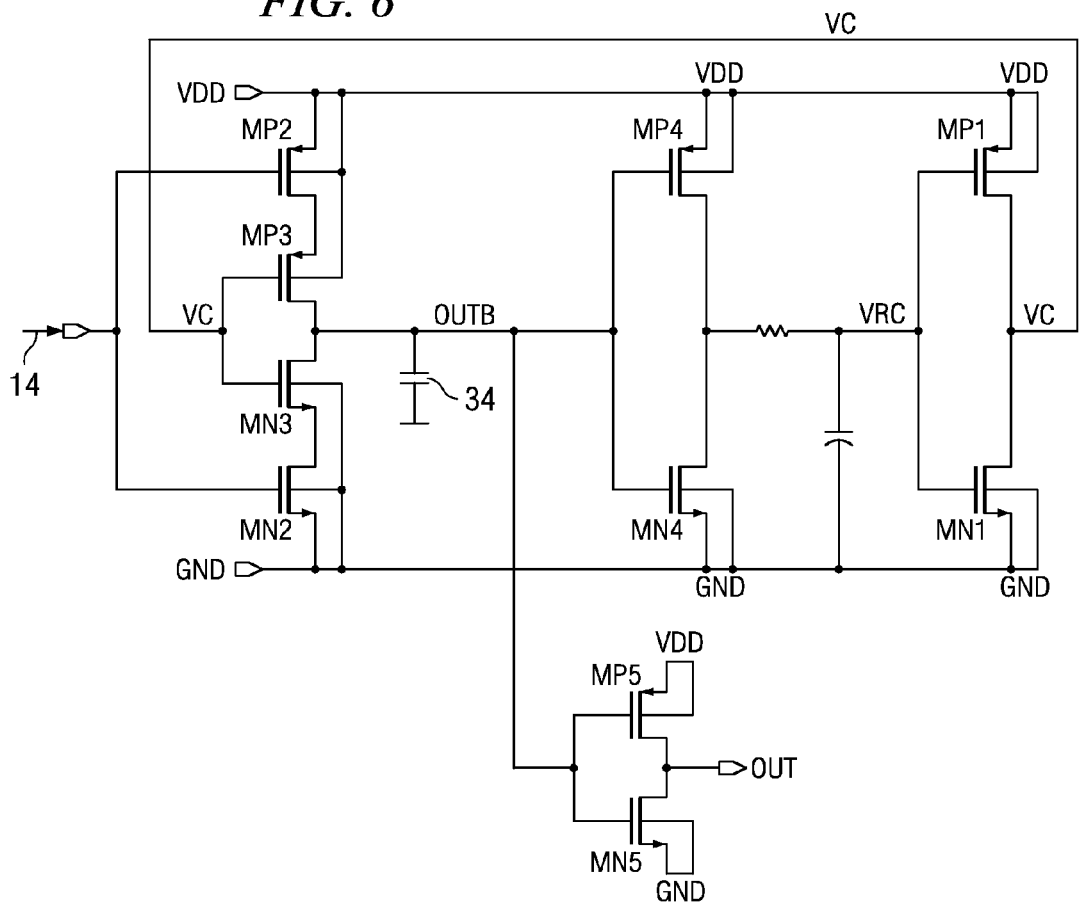
FIG. 6 shows a schematic of the complete duty cycle correction circuit.

FIG. 6 shows a schematic of the complete duty cycle correction circuit. A clock signal 14 is applied to the correction amplifier 16 which is formed by transistors MP2, MP3, MN2 and MN3, as explained with respect to FIG. 4. The schematic of FIG. 6 also shows the RC low pass circuit with resistor R and capacitor C. Capacitor C is shown as a discrete capacitor. This capacitor can be internal or external to the integrated correction circuit. It is also possible to form capacitor C by gate capacitances of two complementary MOS transistors, whereby an NMOS transistor would be connected to VDD and an PMOS transistor would be connected to ground, thus using the gate capacitances as capacitor C. The output voltage VRC of the RC low pass circuit is fed to the second inverter 24, which is formed by the complementary MOS transistor pair MP1 and MN1. The control voltage VC which is the output of inverter 24 is fed back to the gates of transistors MP3 and MN3.

FIG. 6 further shows, in more detail, buffer amplifier 22 which is formed by a complementary MOS transistor pair MP4 and MN4 and output buffer 18 which is formed by a complementary MOS transistor pair MP5 and MN5. Both inverters, the inverter formed by transistors MP4 and MN4 and the inverter formed by transistors MP5 and MN5, act as usual CMOS inverters.

The inventive CMOS duty cycle correction integrated circuit needs very few components and is easy to implement. Using an RC low pass circuit for duty cycle detection and a simple inverter cell as feedback amplifier results in a very stable circuit.

Those skilled in the art to which the invention relates will appreciate that various additions, deletions, substitutions and other modifications may be made to the described embodiments, without departing from the scope of the claimed invention.

What is claimed is:

1. A CMOS integrated circuit for correction of the duty cycle of a clock signal, comprising:
    a correction amplifier with an input to which an input clock signal is applied and an output to which a charge capacitor is connected;
    a voltage controlled resistor arrangement connected in the current path of the correction amplifier and having a resistance control input; and
    a duty cycle detector with an input to which the output of the correction amplifier is applied and with a detection output that supplies a correction voltage representative of a detected duty cycle;
    the duty cycle detector comprising a buffer amplifier and an RC low pass circuit which is formed by a low pass capacitor and a resistor connected to the output of the buffer amplifier; the RC low pass circuit having a time constant t=R*C that is much greater than a period of the clock signal; and the output of the duty cycle detector being applied to the resistance control input of the voltage controlled resistor arrangement.

2. The correction circuit of claim 1, wherein the charge capacitor is formed by an inherent capacitance.

3. The correction circuit of claim 1, wherein the low pass capacitor is a discrete capacitor internal to the correction circuit.

4. The correction circuit of claim 1, wherein the circuit is adapted for connection of a low pass capacitor that is a discrete capacitor external to the correction circuit.

5. The correction circuit of claim 1, wherein the low pass capacitor C is formed by gate capacitances of two complementary MOS transistors.

6. The correction circuit of claim 1, wherein the correction amplifier comprises a pair of complementary MOS transistors with interconnected gates to which the input clock signal is applied.

7. The correction circuit of claim 6, wherein the voltage controlled resistor arrangement comprises a pair of complementary MOS transistors with interconnected gates to which the output of the duty cycle detector is applied.

8. The correction circuit according to claim 7, wherein the voltage controlled resistor arrangement connects the pair of complementary MOS transistors of the correction amplifier in series with each other.

9. The correction circuit according to claim 7, wherein the correction amplifier connects the pair of complementary MOS transistors of the voltage controlled resistor arrangement in series with each other.

10. The correction circuit of claim 1, wherein the buffer amplifier is formed by a first inverter with a series connected complementary MOS transistor pair, the interconnected gates of which constitute the input of the duty cycle detector and to the interconnected drains of which the RC low pass circuit is connected.

11. The correction circuit according to claim 10, wherein the duty cycle detector comprises a second inverter with a series connected complementary MOS transistor pair, the interconnected gates of which are connected to the node of the RC low pass circuit and the interconnected drains of which constitute the output of the duty cycle detector.

12. The correction circuit according to claim 1, further comprising an output buffer formed by a series connected complementary MOS transistor pair, the interconnected gates of which are connected to the output of the correction amplifier and the interconnected drains of which constitute an output for a corrected clock signal.

* * * * *